(12) United States Patent
Lammers et al.

(10) Patent No.: US 9,547,235 B2
(45) Date of Patent: Jan. 17, 2017

(54) IMPRINT LITHOGRAPHY APPARATUS AND METHOD

(75) Inventors: Jeroen Herman Lammers, Eindhoven (NL); Sander Frederik Wuister, Eindhoven (NL); Yvonne Wendela Kruijt-Stegeman, Eindhoven (NL); Roelof Koole, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1664 days.

(21) Appl. No.: 12/898,084

(22) Filed: Oct. 5, 2010

(65) Prior Publication Data

US 2011/0079939 A1    Apr. 7, 2011

Related U.S. Application Data

(60) Provisional application No. 61/249,351, filed on Oct. 7, 2009.

(51) Int. Cl.
  *G03F 7/00* (2006.01)
  *B82Y 10/00* (2011.01)
  *B82Y 40/00* (2011.01)
(52) U.S. Cl.
  CPC ............ *G03F 7/0002* (2013.01); *B82Y 10/00* (2013.01); *B82Y 40/00* (2013.01)
(58) Field of Classification Search
  CPC ......... G03F 7/0002; B82Y 40/00; B82Y 10/00
  (Continued)

(56) References Cited

U.S. PATENT DOCUMENTS

| 6,334,960 B1 | 1/2002 | Willson et al. ............... 216/52 |
| 7,354,698 B2 | 4/2008 | Van Santen et al. |

(Continued)

FOREIGN PATENT DOCUMENTS

| JP | 62-165935 | 7/1987 |
| JP | 2001-223148 | 8/2001 |

(Continued)

OTHER PUBLICATIONS

Japanese Office Action mailed Apr. 23, 2012 in corresponding Japanese Patent Application No. 2010-220095.

(Continued)

*Primary Examiner* — Yogendra Gupta
*Assistant Examiner* — Leith S Shafi
(74) *Attorney, Agent, or Firm* — Pillsbury Winthrop Shaw Pittman LLP (57) ABSTRACT

An imprint lithography method is disclosed for forming a patterned layer from an imprintable liquid medium on a substrate by means of an imprint template having a patterned surface. The method involves contacting the patterned surface and imprintable liquid medium together for a filling period. Light emergent (e.g., scattered or reflected) from an interface between the medium and the patterned surface is collected and measured during the filling period to obtain data concerning one or more voids at the interface, and an estimated end time for the filling period is derived from a relationship between the data and time. The method may allow subsequent process steps to be undertaken more rapidly, with reduced risk of defects arising from remnants of unfilled voids. An imprint lithography apparatus and component for putting the method into effect are also disclosed.

13 Claims, 4 Drawing Sheets

(58) Field of Classification Search
USPC ..... 425/385, 169, 174.4, 135, 293; 264/293, 264/40.1, 319, 406, 408, 447, 494, 496
See application file for complete search history.

(56) References Cited

U.S. PATENT DOCUMENTS

| | | | |
|---|---|---|---|
| 7,360,851 B1 | 4/2008 | Snyder | 347/2 |
| 2004/0124566 A1 | 7/2004 | Sreenivasan et al. | 264/494 |
| 2005/0037143 A1* | 2/2005 | Chou et al. | 427/248.1 |
| 2006/0154179 A1 | 7/2006 | Van Santen et al. | |
| 2006/0268256 A1* | 11/2006 | Kolesnychenko et al. | 355/78 |
| 2007/0018360 A1* | 1/2007 | Kolesnychenko et al. | 264/407 |
| 2007/0145639 A1 | 6/2007 | Seki et al. | 264/293 |
| 2009/0140445 A1 | 6/2009 | Lu et al. | 264/40.1 |
| 2011/0037201 A1 | 2/2011 | Koole et al. | |

FOREIGN PATENT DOCUMENTS

| | | |
|---|---|---|
| JP | 2006-013013 | 1/2006 |
| JP | 2006-203194 | 8/2006 |
| JP | 2006-332678 | 12/2006 |
| JP | 2007-137051 | 6/2007 |
| JP | 2008-270686 | 11/2008 |
| JP | 2009-212449 | 9/2009 |
| JP | 2011-049554 | 3/2011 |
| TW | 200530755 | 9/2005 |
| TW | 200535835 | 11/2005 |
| TW | 200618100 | 6/2006 |
| TW | I313788 | 8/2009 |
| WO | WO 02/067055 | 8/2002 |

OTHER PUBLICATIONS

Haisma, et al., "Mold-assisted nanolithography: A process for reliable pattern replication", J. Vac. Sci. Technol. B., vol. 14(6), Nov./Dec. 1996, pp. 4124-4128.

Kim, et al., "Vinyl ether formulations for step and flash imprint lithography", J. Vac. Sci. Technol. B., vol. 23(6), Nov./Dec. 2005, 2967-2971.

Dickey, et al., "Study of the Kinetics of Step and Flash Imprint Lithography Photopolymerization", AIChE Journal, vol. 51, No. 9, Sep. 2005, pp. 2547-2555.

Dickey, et al., "Kinetic Parameters for Step and Flash Imprint Lithography Photopolymerization", AIChE Journal, vol. 52, No. 2, Feb. 2006, pp. 777-784.

Decker, et al., "Photoinitiated polymerization of vinyl ether-based systems", Progress in Organic Coatings, vol. 42, 2001, pp. 253-266.

Taiwanese Office Action dated Oct. 24, 2012 in corresponding Taiwanese Patent Application No. 099130366.

* cited by examiner

IMPRINT LITHOGRAPHY APPARATUS AND METHOD

This application claims priority and benefit under 35 U.S.C. §119(e) to U.S. Provisional Patent Application No. 61/249,351, entitled "Imprint Lithography Apparatus and Method", filed on Oct. 7, 2009. The content of that application is incorporated herein in its entirety by reference.

FIELD

The present invention relates to imprint lithography apparatus and methods for manufacture of devices.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g., nanometer sized features or sub micron sized features) that has gained increasing interest is so-called imprint lithography, which generally involves the use of a "stamp" (often referred to as an imprint template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve bringing together a patterned surface of an imprint template and a layer of imprintable liquid medium (e.g., moving the imprint template toward the imprintable medium, or moving the imprintable medium toward the imprint template, or both) such that the imprintable medium flows into recesses in the patterned surface and is pushed aside by protrusions on the patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint template and the patterned imprintable medium are then separated. The substrate and patterned imprintable medium are then typically processed further in order to pattern or further pattern the substrate. The imprintable medium may be provided in the form of droplets on the surface of a substrate to be patterned, but may alternatively be provided using spin coating or the like.

SUMMARY

Imprint lithography, such as UV-imprint lithography, particularly, step and flash imprint lithography (SFIL), typically involves the dispensing of an array of droplets of a curable imprintable liquid medium, such as a UV-curable photoresist onto a substrate, followed by alignment of a patterned surface of an imprint template with the array of droplets, or alignment of a patterned surface of an imprint template with the substrate, and bringing together the patterned surface and substrate so that the patterned surface of the imprint template contacts the droplets. The term "UV" is used here for convenience but should be interpreted as including any suitable actinic radiation for curing the imprintable liquid medium. As the patterned surface and/or the substrate are moved and then held together for a filling period, the droplets may spread out and flow to substantially fill recesses in the patterned surface. Gaps between the droplets may lead to voids at the interface between the patterned surface and the imprintable liquid medium which may eventually disappear as they become filled with the imprintable liquid medium. Gas or vapor in such voids may have to be displaced by the imprintable liquid medium and so the filling of the voids may be time consuming if the gas or vapor must diffuse into the medium or the template.

The imprintable liquid medium is typically subsequently cured, for instance by UV radiation, with the imprint template and substrate held together for a holding period, with the curable imprintable liquid medium sandwiched between them. For UV imprint lithography, UV-irradiation may be directed through the imprint template, which is adapted to be transparent or translucent to UV-radiation, onto the UV-curable medium. For instance the imprint template may be of a material such as quartz. Once the UV-curable imprintable liquid medium has cured sufficiently such that the resulting patterned layer of cured medium is self-supporting, then the imprint template may become out of contact with from the substrate and the resulting patterned layer. By "self-supporting" it is meant that the patterned layer is of sufficiently high viscosity or sufficiently gelled or solidified or hardened to maintain the imprinted shape of the patterned surface once the imprint template has come out of contact with the substrate and the resulting patterned layer. The imprint template may then come into contact with other substrates, or to another part of the same substrate, and the process repeated. Patterns in the cured layers may be transferred to the underlying substrate by conventional etch techniques such as those commonly used, for instance, in optical lithography.

If any voids remain at the interface between imprintable liquid medium and the patterned surface when the imprintable liquid medium is cured or solidified, these will be present as undesirable defects in the resulting self-supporting patterned layer. Hence, it is desirable that the voids are substantially filled while the imprintable liquid medium is still flowable.

The time required to help ensure filling of voids, referred to as the filling period, may lead to a low throughput rate, compared to other lithography techniques, such as optical lithography, and may be a problem for imprint lithography methods. The time taken for the droplets of imprintable liquid medium to flow into the voids, to ensure that the recesses of the patterned surfaces are substantially filled, may be one of the most time-consuming steps of the overall process typically in excess of 2 seconds. Because of the time taken for the imprintable liquid medium to flow into recesses to substantially fill them, the viscosity of the imprintable liquid medium should be kept as low as possible, until the voids are filled, to encourage flow. In UV imprint lithography, curing of the UV-curable imprintable liquid medium into a self-supporting patterned layer commences after sufficient time has passed to ensure a high probability that the recesses of the patterned surface have been filled. This is in order to ensure that the viscosity of the UV-curable imprintable liquid medium is not increased until the recesses of the patterned surface are sufficiently filled. The holding period, during which curing typically occurs, often requires further time for curing, for instance 0.5 to 1 seconds for UV imprint lithography, and so may also make a significant contribution to total process time.

It is desirable, for example, to provide an imprint lithography method and apparatus that enable the contribution of the time required to help ensure low defect levels arising from voids to be reduced. It is desirable, for example, to provide an imprint lithography method and apparatus that allows more rapid separation of a patterned surface of an imprint template and a patterned layer on a substrate formed by imprint lithography, particularly by UV-Imprint lithography such as SFIL, in order to increase process throughput rates, without increasing the level of defects arising from voids. It is desirable, for example, to provide an imprint lithography method and apparatus that enable the duration of the filling period and/or holding period to be reduced to a minimum while reducing or overcoming one or more problems in the prior art, or while providing an alternative method or apparatus to the prior art. It is desirable, for example, to provide an imprint lithography apparatus and method which do not require substantial modifications to the physical features and characteristics of the imprint lithography apparatus or method, such that an embodiment of the invention may be put into effect by minor modifications to an existing imprint lithography apparatus or method, particularly an UV imprint lithography apparatus or method.

An embodiment of the invention provides an imprint method for forming a patterned layer from an imprintable liquid medium on a substrate by means of an imprint template having a patterned surface comprising recesses, the method comprising:

providing the imprintable liquid medium on the substrate and/or patterned surface as a flowable liquid, contacting together the patterned surface and the imprintable liquid medium on the substrate and/or patterned surface for a filling period having an end time when the imprintable liquid medium has substantially filled the recesses in the patterned surface, measuring light emergent from an interface between the imprintable liquid medium and the patterned surface during the filling period to obtain data concerning one or more voids at the interface, and deriving an estimated end time from a relationship between the data and time.

The relationship between the data and time may be a relationship based upon the voids shrinking with time so that eventually even the largest voids may have vanished completely such that the liquid medium has substantially filled the recesses in the patterned surface. Hence the relationship between the data and time may be based upon a diminution in the amount of radiation scattered, the size of voids imaged, or the like as time progresses. The relationship may be based on theoretical and/or empirical (i.e. practical) knowledge of how the data is expected to vary with time as the filling period progresses.

The features herein (e.g., the following features) are applicable to all the various embodiments of the methods and apparatus of the invention where appropriate. When suitable, combinations of the following features may be employed as part of the method and apparatus described herein, for instance as set out in the claims. The method and apparatus described herein are particularly suitable for UV-imprint lithography, particularly for step and flash imprint lithography (SFIL).

The contacting together of the imprint template and substrate may not require the patterned surface of the imprint template and the substrate to be parallel at initial contact when the patterned surface first touches the imprintable liquid medium.

The method may comprise directing the light from a light source onto the interface. By "light" in this specification is meant any suitable electromagnetic radiation such as visible light, infra-red, ultra-violet and the like. If ultra violet light is used it should desirably be of a wavelength that does not cure the imprintable liquid medium. Typically, the light may be visible light.

By "emergent from the interface" is meant that the light is reflected, scattered, refracted or the like from the interface. Typically, the light will be reflected or scattered from the interface and any voids therein or thereat. The term "light emergent from an interface between the imprintable liquid medium and the patterned surface" should be taken to also include light emergent from the interface between the patterned surface and gas/vapor in the voids at the interface.

The voids at the interface are regions where the imprintable liquid medium has not yet reached during the filling period and so will be present at the interface as gas and/or vapor bubbles. In other words, the voids may contain gas or vapor but are empty of imprintable liquid medium. As the refractive index of the void may typically be different from that of the imprintable liquid medium, the surfaces between the voids and the imprintable liquid medium and/or the patterned surface will reflect, refract or scatter light. The voids may include voids at the edges of the patterned surface of the imprint template.

The data may include information related to a size of the voids. The data may include information related to a rate of change of the size of the voids. For instance, the data may relate to light scattered by voids in which case there may be a relationship between the size of the voids and the nature and/or intensity of the light scattered.

The light emergent from the interface may be focused to form an image of the interlace and voids and the image may be analyzed to select a set of voids from which the data concerning one or more voids at the interlace is obtained. In other words, a set of voids may be selected which are most likely to determine the end time of the filling period, typically the largest voids. For instance, an imaging apparatus, such as a camera, may be used to form an image of the interface and/or voids.

The set of voids may be a set of voids wherein each void has a size larger than a size-related statistic for the voids. Commercially available image analysis software may be used to measure the distribution of sizes for the voids, for instance based on the distribution of the surface area based diameter for the voids (i.e. the diameter a void would have if it were a circle having the same surface area as the void in the image). From the distribution of sizes, a statistic such as the mean, median, $d_{90}$ (the size where 90% of voids by area have a size smaller than $d_{90}$) may be selected and only the set of voids larger than the selected statistic used to generate the data. The set of voids may be selected to be from a region of the image of the interface having, on average, larger voids than the remainder of the interface. For instance, the data may be from a single void, for example the largest void present.

The method may comprise a learning process by which the relationship between data and time is modified using information from defect levels arising from unfilled voids in one or more previously patterned layers. Information about defect levels may be measured by any suitable method such as by image analysis. Where high defect levels are found arising from voids still remaining at the estimated end time, the relationship may be adjusted to give an increase in the estimated end time derived from the data.

A commencement time of one or more further processing steps may be determined from the estimated end time. The commencement of a further processing step may be before, during or after the estimated end time.

For instance, when the imprintable liquid medium is a UV-curable medium, the one or more further processing steps may include illuminating the UV-curable imprintable liquid medium with UV-radiation for an illumination period. The illuminating of the UV-curable imprintable liquid medium may, for instance commence prior to the estimated end time. This may be particularly useful where the UV-curable imprintable liquid medium exhibits an inhibition period during which it has a viscosity which remains substantially unchanged (e.g. the viscosity does not increase by more than 10% during the inhibition period) following the start of the UV illumination period. For instance the UV-curable imprintable liquid medium may be an acrylate resist or a vinyl ether resist.

Acrylates and silicon-containing acrylates are suitable monomers for use in the UV-curable imprintable liquid medium.

The UV-curable imprintable liquid medium may be a medium which cures by means of a reaction catalyzed by UV-generated catalyst. For instance, the UV-curable imprintable liquid medium may be a vinyl ether UV photoresist. Vinyl ether monomers, particularly monomers including silicone groups, are of use in an embodiment of the invention (Kim et al, J. Vac Sci Tech B, 2005, 23, 2967). The polymerization of such vinyl ethers is thought to be initiated by acids, and photo-acid generators (PAGs) that form protons upon UV-illumination may be used as initiator molecules.

An embodiment of the invention provides an imprint method for forming a patterned layer from an imprintable liquid medium on a substrate by means of an imprint template having a patterned surface comprising recesses, the method comprising:

providing the imprintable liquid medium on the substrate and/or patterned surface as a flowable liquid, contacting the patterned surface with the imprintable liquid medium, and calculating an estimated time required for the imprintable liquid medium to substantially fill the recesses in the patterned surface from data collected from measurement of light emergent from an interface between the imprintable liquid medium and the patterned surface.

An embodiment of the invention provides an imprint method comprising:

providing an imprintable medium on a substrate as a flowable liquid, bringing a patterned surface of an imprint template and imprintable medium on a substrate into contact with each other for a filling period having an end time when the imprintable medium has substantially filled recesses in the patterned surface of the imprint template, measuring a light emergent from an interface between the imprintable medium and the patterned surface of the imprint template during the filling period to obtain data concerning one or more voids at the interface, and estimating the end time of the filling period from a relationship between the data and time.

An embodiment of the invention provides an imprint apparatus comprising:

an imprint holder configured to hold an imprint template, the imprint template having a patterned surface to pattern an imprintable liquid medium on a substrate by contact between the patterned surface and the imprintable liquid medium, a substrate table configured to hold the substrate, a detector configured to generate a signal derived from light emergent from an interface between the imprintable liquid medium and the patterned surface, during a filling period as imprintable liquid medium substantially fills the recesses in the patterned surface, and a computer configured to derive data from the signal concerning one or more voids at the interface during the filling period, and to derive an estimated end time for the filling period from a relationship between the data and time.

In an embodiment, the imprint apparatus further comprises a dispenser for dispensing imprintable liquid medium onto the substrate An embodiment of the invention provides an imprint apparatus comprising:

an imprint holder configured to hold an imprint template, the imprint template having a patterned surface to pattern an imprintable liquid medium on a substrate by contact between the patterned surface and the imprintable liquid medium, a substrate table configured to hold the substrate, a detector configured to collect and measure light emergent from an interface comprising one or more voids between the imprintable liquid medium and the patterned surface and to generate a signal therefrom, and a computer configured to calculate an estimated end time required for the imprintable liquid medium to substantially fill the recesses in the patterned surface from data derived from the signal generated by the detector In an embodiment, the imprint apparatus further comprises a dispenser for dispensing imprintable liquid medium onto the substrate and/or a controller arranged to control the operation of the apparatus.

The following features are applicable to all the various embodiments of the method and apparatus of an embodiment of the invention where appropriate. When suitable, combinations of the following features may be employed as part of the method and apparatus described herein, for instance as set out in the claims.

The apparatus may comprise a light source configured to direct light onto the interface. Suitably, the apparatus may further comprise a focusing device configured to form an image of the interface at the detector. For instance the apparatus may comprise a camera arranged to form an image of the interface. The detector and/or light source may be positionable such that they do not obstruct any UV radiation intended for curing of the imprintable liquid medium. Hence, the detector and/or light source may for instance be positioned at a location over the substrate to enable collection and measurement of light emergent from the interface and then repositioned to a location remote from the substrate prior to UV illumination of the imprintable liquid medium on the substrate.

The apparatus may also comprise an image analyzer configured to analyze the image to obtain the data from images of voids at the interface.

The controller may be arranged to commence one or more further processing steps at one or more commencement times determined from the estimated end time. These commencement times may be before, at or after the estimated end time.

The imprintable liquid medium may be a UV-curable medium and the one or more further processing steps may comprise illuminating the UV-curable imprintable liquid medium with UV radiation for an illumination period. For instance, the illumination of the UV-curable imprintable liquid medium may commence prior to the estimated end time.

An embodiment of the invention provides a controller for an apparatus according to an embodiment of the invention wherein the controller is arranged to commence one or more further processing steps at one or more commencement times determined from the estimated end time.

BRIEF DESCRIPTION OF THE DRAWINGS

Specific embodiments of the invention will be described with reference to the accompanying figures, in which.

DETAILED DESCRIPTION

Figure 1:
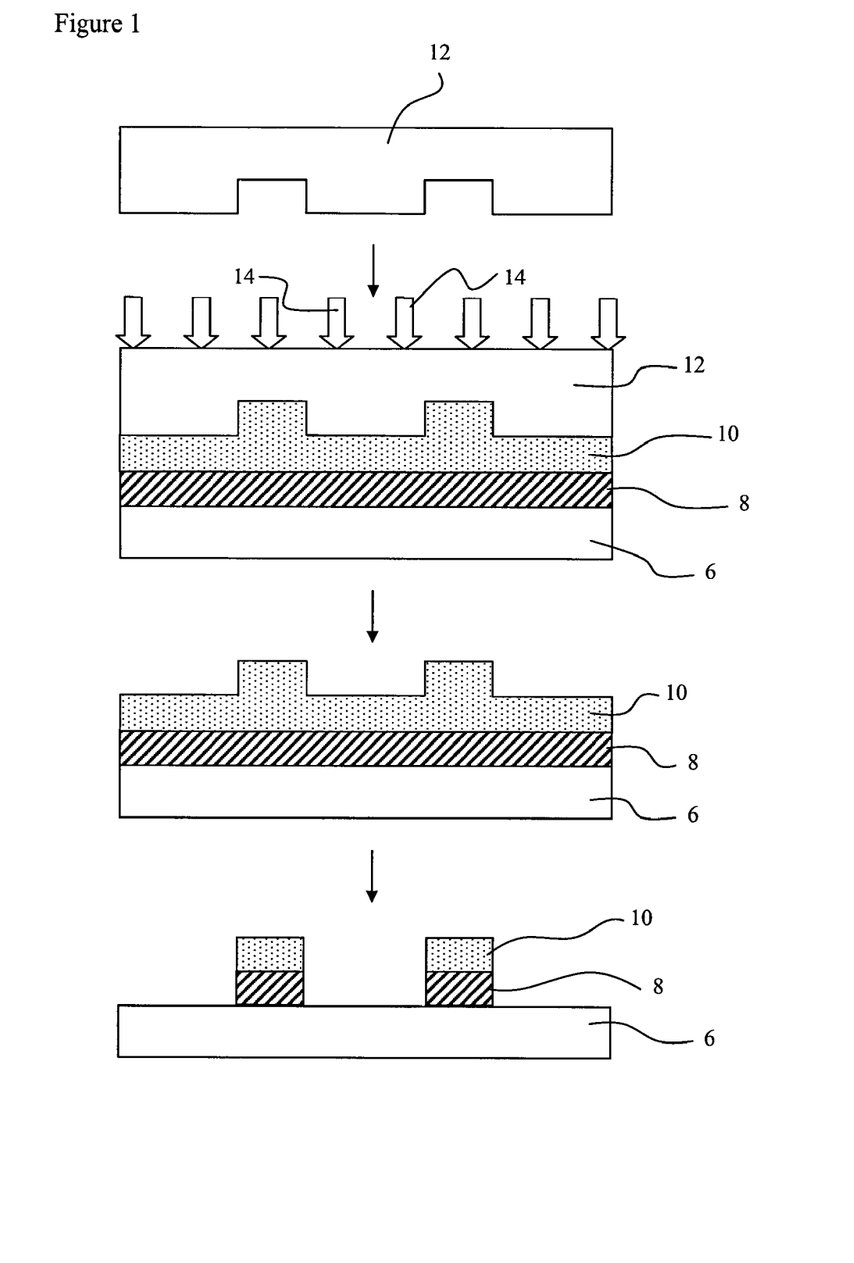
FIG. 1 schematically shows an example of UV-imprint lithography.

FIG. 1 shows an example of UV imprint lithography, which involves the use of a transparent or translucent imprint template which is transmissive to UV and a UV-curable liquid as imprintable liquid medium (the term "UV" is used here for convenience but should be interpreted as including any suitable actinic radiation for curing the imprintable liquid medium). An UV-curable liquid is often less viscous than a thermosetting or thermoplastic resin used in hot imprint lithography and consequently may move much faster to fill imprint template pattern features.

A substrate 6 is provided with a planarization and transfer layer 8. UV-curable imprintable medium 10 is provided on the planarization and transfer layer 8. A quartz imprint template 12 is brought into contact (i.e. imprinted into) with the UV-curable imprintable medium 10. A pattern formed by pattern features of the quartz imprint template 12 is frozen by curing the UV-curable imprintable medium 10 with UV radiation 14 that is applied through the quartz imprint template 12 onto the UV-curable imprintable medium 10. After removal of the imprint template 12, the UV-curable imprintable medium 10 is etched such that thinner areas of the UV-curable imprintable medium 10 are etched down to the substrate. A particular manner of patterning a substrate through UV imprint lithography is so-called step and flash imprint lithography (SFIL), which may be used to pattern a substrate in small steps in a similar manner to optical steppers conventionally used in IC manufacture. This may involve printing small areas of the substrate at a time by imprinting an imprint template into UV-curable imprintable medium, "flashing" UV radiation through the imprint template to cure the UV-curable imprintable medium beneath the imprint template, bringing the imprint template out of contact with the UV-curable imprintable medium, stepping to an adjacent portion of the substrate and repeating the operation.

The small field size of such step-and-repeat processes may assist in reducing pattern distortions and critical dimension variations so that SFIL may be particularly suited to the manufacture of integrated circuits and other devices requiring high overlay accuracy.

For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Figure 2A:
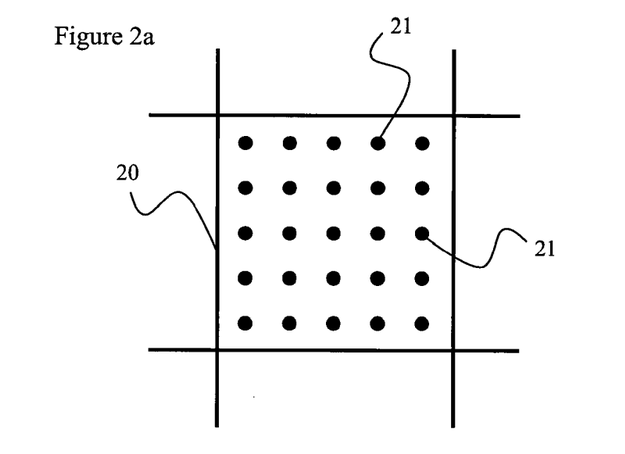
FIGS. 2a to 2c schematically depict plan views of an area of a substrate with drops of imprintable UV-curable liquid medium thereon as viewed through an imprint template as the substrate and imprint template are contacted together.

FIG. 2a schematically depicts a plan view of an area 20 of a substrate as viewed through the imprint template (not shown in this Figure). The lines 20 are not necessarily physically present and are merely present to demarcate an area of the substrate. An imprintable liquid medium dispenser has been used to provide a plurality of drops of imprintable liquid medium 21 on to the area 20 of the substrate. Once the drops of imprintable liquid medium have been provided on the substrate, the imprint template may be brought into contact with the drops of imprintable liquid medium (by appropriate movement of the imprint template and/or the substrate).

Figure 2B:
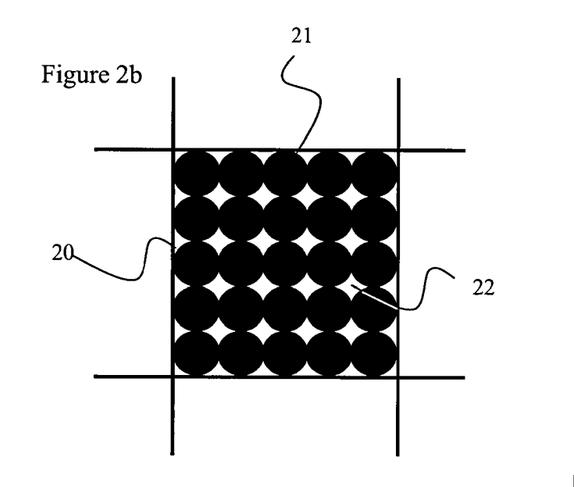

FIG. 2b shows the drops of imprintable liquid medium 21 when the imprint template has been brought into contact with the imprintable liquid medium for a certain time (imprint template is not shown in this Figure). Bringing the imprint template into contact with the imprintable liquid medium causes the drops of imprintable liquid medium 21 to spread out. The drops of imprintable liquid medium come into contact with one another and, at least to some extent, begin to coalesce. The imprint process may take place in a gaseous atmosphere such as helium. Thus, as the drops of imprintable liquid medium 21 come into contact with one another, pockets of gas 22 (e.g. pockets of helium gas) are trapped in-between the drops 21, the imprint template and the substrate to form voids at the interface between a patterned surface of the imprint template and the imprintable liquid medium. Although referred to as voids, these voids at the interface may be filled with gas or vapor. It is desirable to allow the voids to be filled by imprintable liquid medium, replacing the void as gas diffuses away from the void. In order for this to happen, time is needed to allow the gas to diffuse, for example into the substrate and/or imprint template, so that the voids may be filled.

Figure 2C:
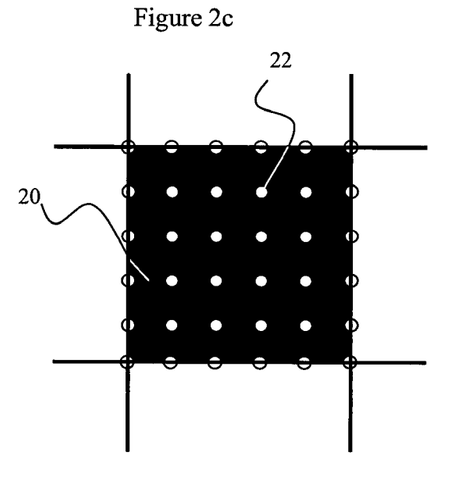

FIG. 2c schematically depicts the locations of the voids remaining as they become partially filled relative to the area 20 of the substrate. Eventually the voids will disappear completely. Any voids which are still present after the imprintable liquid medium has been cured may give rise to defects in the resulting patterned layer of cured medium and in any devices subsequently formed therefrom on and/or in the substrate.

Although the droplets of imprintable liquid medium and voids are shown to be of uniform size and spacing in the Figures, it will be apparent that in practice such regularity may not be present so that there may be a statistical distribution of void sizes present at the interface at any particular time.

Figure 3:
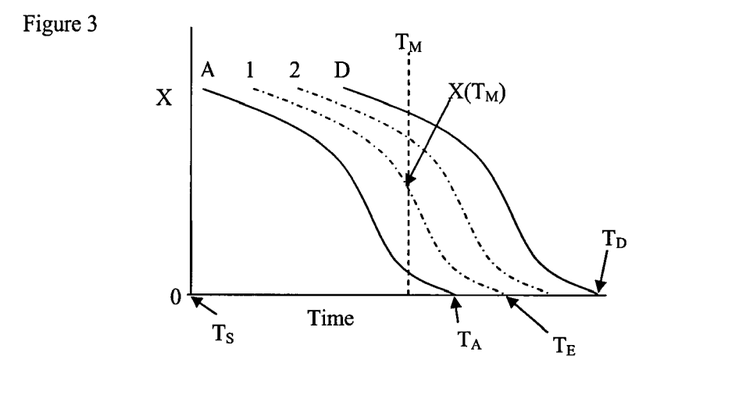
FIG. 3 shows a graph with curves indicating how a parameter X derived from data relating to the voids varies as a function of time.

FIG. 3 shows a graph with curves showing how a parameter X derived from data relating to the voids varies as a function of time. The ordinate axis shows X and the abscissa indicates time with the zero value of the abscissa corresponding to the start of the filling period $T_S$. Arbitrarily, the filling period may be considered to commence as the imprint template first contacts the imprintable liquid medium. The parameter X may be any suitable parameter related to the voids at the interface at time t. In this example, when X=0 then the voids are completely filled. For instance, the parameter X may be the $d_{90}$ value for the set of voids, where $d_{90}$ is a size such that 90% by area of voids have a diameter less than $d_{90}$. X may, for instance, be a parameter derived by image analysis of an image of the interlace.

FIG. 3 shows four curves schematically representative of the behavior of X as a function of time. Curves A and D represent the most extreme behavior expected from the statistical variation in voids at the interface within say 99.5% probability range, leading to the least filling time $T_A$ and the greatest filling time $T_D$ expected.

Curves 1 and 2 show typical behavior of X versus time between the extremes, with curve 1 having a filling time $T_E$. By measurement of X at a time $T_M$, where $T_M$ is at a time before $T_A$ and $T_E$ lies between $T_A$ and $T_D$, it is possible to derive, from knowledge of the shape of the curve 1, an estimated time $T_E$ by when the voids should be completely filled.

Figure 4:
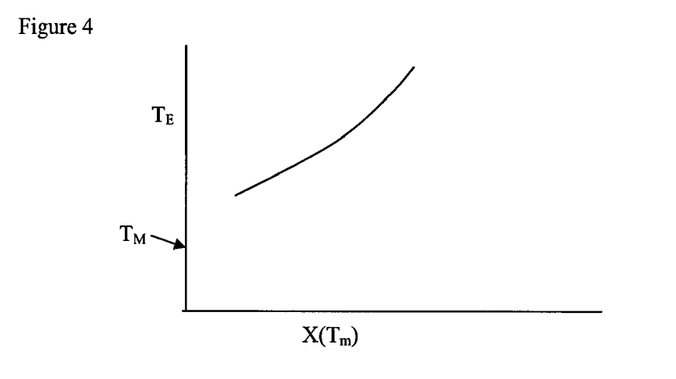
FIG. 4 shows a graph of estimated end time for the filling period $T_E$ (as ordinate) as a function of parameter X (abscissa) measured at a measurement time $T_M$.

In practice, the curves relating X to time may be measured for any particular system, i.e. arrangement of imprint lithography apparatus, substrate, imprint template, imprintable liquid medium, etc. From knowledge of the curves, the relationship between $T_E$ and $X(T_M)$ may be derived. Such a relationship is shown schematically in FIG. 4 in a graph showing how $T_E$ as ordinate varies as a function of $X(T_M)$ as abscissa. The measurement time $T_M$ is also indicated in FIG. 4. Clearly, this must be earlier than any estimated time $T_E$ by which the voids are estimated to be filled. The relationship between $X(T_M)$ and $T_E$ is suitably obtained, theoretically or experimentally, prior to putting an embodiment of the invention into practice for a particular system. However, the relationship may be further modified by inclusion of additional information relating to the relationship between $X(T_M)$ and $T_E$ derived from imprints carried out using the method of an embodiment of the invention. In other words, an embodiment of the invention may incorporate a learning process whereby the relationship between $X(T_M)$ and $T_E$ is refined during use.

Rather than simply taking a measurement of X at a single time, $T_M$, a measurement of X may be taken at time $T_M$ and a measurement of $\Delta X$ may be taken at time $T_{M+}\Delta T$. The difference between the measured values of X, $\Delta X$, may be used to provide $\Delta X/\Delta T$—a rate of change for X at $T_M$. From the knowledge of $\Delta X/\Delta T$ at $T_M$ and its relationship to $T_E$ derivable from curves of X versus time, the value of $\Delta X/\Delta T$ may be used to provide $T_E$ perhaps more accurately than by using $X(T_M)$ alone. In another embodiment the knowledge of $\Delta X/\Delta T$ at $T_M$ alone is used to estimate $T_E$.

Prior to this embodiment, in order to ensure a high probability that the voids were filled before moving on to the next step in processing, it would have been necessary to extend the filling time to $T_D$ or longer to ensure a high likelihood, such as 99.5%, that all voids had been eliminated from the interface prior to curing of the imprintable liquid medium.

Figure 5:
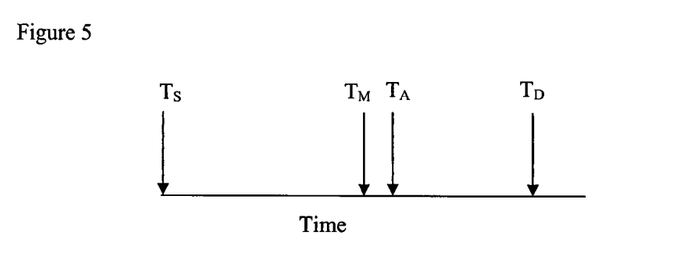
FIGS. 5 and 6 show schematic timelines for the void filling period.
Figure 6:
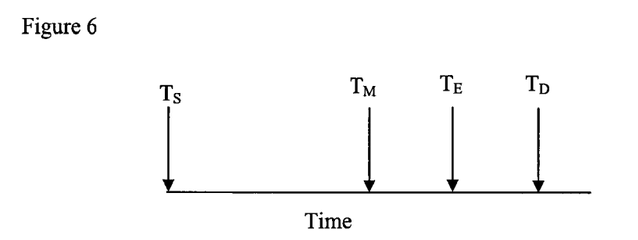

FIG. 5 shows a time line for the filling period, commencing at $T_S$ and proceeding from left to right with increasing time. The sequence of $T_M$, $T_A$ and $T_D$ is shown. By measurement of $X(T_M)$ at $T_M$, $T_E$ may be derived from the curve in FIG. 4, leading to a reliable estimate of the time by which it is say 99.5% certain that all voids will be filled. This means that subsequent process steps do not have to be delayed until $T_D$: it is only necessary to wait until $T_E$.

If an embodiment of the invention is applied to UV-imprint lithography, the imprintable liquid medium may be a UV-curable imprintable liquid medium. It may, for instance, be a UV-curable medium which exhibits an inhibition period.

UV-curable imprintable media used in UV-imprint lithography may exhibit UV curing that is initially inhibited for a short time. For instance, acrylate-type resists suffer from oxygen inhibition. It has been demonstrated that oxygen dissolved in the resist formulation reacts with photo-generated radicals in an acrylate-initiator mixture (M. D. Dickey et al., AIChE J., 2005, 51, 2547 and M. D. Dickey et al., AIChE J., 2006, 52, 777). The radicals react with oxygen to form stable peroxy radicals, and this reaction is rapid compared to the polymerization reaction. It is thought that this causes a certain inhibition time before the desired polymerization reaction of acrylates takes place. The inhibition time may depend, for instance, upon initiator concentration, oxygen concentration, and UV power (M. D. Dickey et al., AIChE J., 2005, 51, 2547). The inhibition time ranges from 0.5 s up to a few seconds.

Vinyl ether-type resists also exhibit inhibition times of the order of 1 to 2 seconds (C. Decker et al., Progr. Org. Coat. 2001, 42, 253). The underlying mechanism of the inhibition time in case of acid-catalyzed vinyl ether polymerization reaction is not well understood. It was suggested by Decker et al. that there is a short delay between the photolysis of the PAG (e.g. a sulfonium salt), and the actual production of protons.

The inhibition period observed in the polymerization reaction of both acrylates and vinyl ethers may limit throughput for UV-imprint lithography processes. Previously, the initiation of UV illumination to cure the imprintable liquid medium would not take place until after all voids were gone. The viscosity (and other relevant physical properties) of the imprintable medium formulation do not change substantially during the inhibition period. In other words, the ability of the UV-curable imprintable liquid medium 10 to flow into recesses of the patterned surface of an imprint template 12 is not substantially impaired during the inhibition period.

Hence, by commencing the UV-illumination prior to the estimated end time for void filling $T_E$, it is possible to initiate the chemical processes which will eventually lead to curing of the UV-curable imprintable liquid medium without substantially affecting the filling of the recesses in the patterned surface of the imprint template 12. It is highly desirable that the filling step should be completed (i.e. the recesses should be substantially filled by the UV-curable liquid) before the inhibition period has elapsed. Following the end of the inhibition period, the viscosity of the UV-curable medium may increase rapidly, which would slow or prevent the flow of the UV-curable liquid into the recesses of the patterned surface of the imprint template 12.

Because the UV-illumination period may be commenced some time before the estimated end time for void filling $T_E$, the overall period from initial contact $T_S$ to completion of the imprint may be reduced without any loss in the ability of the UV-curable medium to substantially fill the recesses in the patterned surface 12, yet with the UV-illumination applied for the same length of time and at the same power as for prior art methods.

An advantage of an embodiment of the invention is that only minor mechanical adaptations or modifications to an existing UV-imprint lithography apparatus or method are required to implement an embodiment of the present invention, such as the incorporation of a detector. Changes in the timing at which the process steps take place may be effected by modifications to the software control of the apparatus. For instance the commencement of a UV illumination step may be commenced at or before $T_E$ rather than waiting until $T_D$.

The present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. In particular, the methods and apparatus are suitable for high resolution lithography, where features patterned onto a substrate have a feature width or critical dimension of about 1 μm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. Lithographic apparatus therefore usually includes an alignment apparatus, which may be used to align each pattern with a previously provided pattern, and/or with alignment marks provided on the substrate.

Typically, the substrate is clamped to a substrate holder and the substrate holder and imprint template or imprint templates are moveable relative to each other between imprints. Generally, a controller, such as a computer running a computer program, uses information from the alignment apparatus to control the positions of the substrate and the imprint template or templates relative to each other as each pattern is imprinted.

In the above embodiments, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint template arrangements. In an embodiment, there is provided an apparatus configured to use one template holder arrangement per substrate holder. In an embodiment, there is provided an apparatus configured to use more than one template holder arrangement per substrate holder. In an embodiment, there is provided an apparatus that includes a plurality (e.g. 2, 3, or 4) of imprintable liquid medium dispensers. In an embodiment, there is provided an apparatus configured to use one imprintable liquid medium dispenser per substrate holder. In an embodiment, there is provided an apparatus configured to use one imprintable liquid medium dispenser per imprint template arrangement. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprint medium dispenser, and/or a radiation source (for curing the imprintable liquid medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

In order to aid release of the patterned surface from the imprintable liquid medium after patterning, the patterned surface may comprise a release layer comprising or consisting essentially of titania, alumina, tantalum oxide or mixtures thereof, or may comprise an organic release layer.

The imprintable liquid medium may be hardened by actinic radiation, such as UV radiation, applied through the imprint template. In order to facilitate this, the porous solid medium may be transmissive (i.e. transparent or translucent) to actinic radiation such as UV radiation. Silica is useful for this purpose.

In this specification, the term "substrate" is meant to include any surface layers forming part of the substrate, or being provided on another substrate, such as planarization layers or anti-reflection coating layers.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting, Thus, it will be apparent to those skilled in the art that modifications may be made to the invention as described without departing from the scope of the claims set out below.

Embodiments of the invention are provided in below numbered clauses:

1. An imprint method for forming a patterned layer from an imprintable liquid medium on a substrate by means of an imprint template having a patterned surface comprising recesses, the method comprising:

contacting together the patterned surface and imprintable liquid medium on the substrate and/or patterned surface for a filling period having an end time when the imprintable liquid medium has substantially filled the recesses in the patterned surface, measuring light emergent from an interface between the imprintable liquid medium and the patterned surface during the filling period to obtain data concerning one or more voids at the interface, and deriving an estimated end time from a relationship between the data and time.

2. The imprint method of clause 1, comprising directing the light from a light source onto the interface.

3. The imprint lithography method of clause 1 or clause 2, wherein the data includes information related to a size of the one or more voids.

4. The imprint lithography method of any preceding clause, wherein the data includes information related to a rate of change of the size of the one or more voids.

5. The imprint lithography method of any preceding clause, wherein the light emergent from the interface is focused to form an image of the interface and the image is analyzed to select a set of voids from which the data is obtained.

6. The imprint lithography method of clause 5, wherein each of the voids in the set of voids has a size larger than a size-related statistic for the voids.

7. The imprint lithography method of any preceding clause, further comprising a learning process by which the relationship is modified using information from defect levels arising from remnants of unfilled voids in one or more previously patterned layers.

8. The imprint lithography method of any preceding clause, wherein a commencement time of one or more further processing steps is determined from the estimated end time.

9. The imprint lithography method of clause 8, wherein the imprintable liquid medium is a UV-curable medium and the one or more further processing steps comprises illuminating the UV-curable medium with UV-radiation for an illumination period.

10. The imprint lithography method of clause 9, wherein the UV-curable medium exhibits an inhibition period following illumination with UV-radiation during which it has a viscosity which remains substantially unchanged.

11. The imprint lithography method of clause 10, wherein illuminating the UV-curable imprintable liquid medium commences prior to the estimated end time.

12. The imprint lithography method of clause 10 or clause 11, wherein the UV-curable imprintable liquid medium is an acrylate resist or a vinyl ether resist.

13. An imprint method for forming a patterned layer from an imprintable liquid medium on a substrate by means of an imprint template having a patterned surface comprising recesses, the method comprising:
  contacting the patterned surface with imprintable liquid medium on the substrate and/or patterned surface, and
  calculating an estimated time required for the imprintable liquid medium to substantially fill the recesses in the patterned surface from data collected from measurement of light emergent from an interface between the imprintable liquid medium and the patterned surface.

14. An imprint method comprising:
  bringing a patterned surface of an imprint template and imprintable medium on a substrate into contact with each other for a filling period having an end time when the imprintable medium has substantially filled recesses in the patterned surface of the imprint template,
  measuring a light emergent from an interface between the imprintable medium and the patterned surface of the imprint template during the filling period to obtain data concerning one or more voids at the interface, and
  estimating the end time of the filling period from a relationship between the data and time.

15. An imprint apparatus comprising:
  an imprint holder configured to hold an imprint template, the imprint template having a patterned surface to pattern an imprintable liquid medium on a substrate by contact between the patterned surface and the imprintable liquid medium,
  a substrate table configured to hold the substrate,
  a detector configured to generate a signal derived from light emergent from an interface between the imprintable liquid medium and the patterned surface, during a filling period as imprintable liquid medium substantially fills the recesses in the patterned surface, and
  a computer configured to derive data from the signal concerning one or more voids at the interface during the filling period, and to derive an estimated end time for the filling period from a relationship between the data and time.

16. An imprint apparatus comprising:
  an imprint holder configured to hold an imprint template, the imprint template having a patterned surface to pattern an imprintable liquid medium on a substrate by contact between the patterned surface and the imprintable liquid medium,
  a substrate table configured to hold the substrate,
  a detector configured to collect and measure light emergent from an interface comprising one or more voids between the imprintable liquid medium and the patterned surface and to generate a signal therefrom, and
  a computer configured to calculate an estimated end time required for the imprintable liquid medium to substantially fill the recesses in the patterned surface from data derived from the signal generated by the detector.

17. The apparatus of clause 15 or clause 16, further comprising a light source configured to direct the light onto the interface.

18. The apparatus of any of clauses 15 to 17, further comprising a focusing device arranged to form an image of the interface at the detector.

19. The apparatus of clause 18, further comprising an image analyzer configured to analyze the image to obtain the data from an image of the one or more voids at the interface.

20. The apparatus of any of clauses 15 to 19, further comprising a controller configured to control operation of the apparatus, the controller arranged to commence one or more further processing steps at one or more commencement times determined from the estimated end time.

21. The apparatus of clause 20, wherein the imprintable liquid medium is a UV-curable medium and the one or more further processing steps comprises illuminating the UV-curable medium with UV-radiation for an illumination period.

22. The apparatus of clause 21, wherein illuminating the UV-curable imprintable liquid medium commences prior to the estimated end time.

23. A controller for an apparatus according to any of clauses 15 to 22 wherein the controller is arranged to commence one or more further processing steps at one or more commencement times determined from the estimated end time.

The invention claimed is:

1. An imprint apparatus comprising:
  an imprint holder configured to hold an imprint template, the imprint template having a patterned surface to pattern an imprintable liquid medium on a substrate by contact between the patterned surface and the imprintable liquid medium,
  a substrate table configured to hold the substrate,
  a detector configured to generate a signal derived from light emergent from an interface between the imprintable liquid medium and the patterned surface, during a filling period as imprintable liquid medium substantially fills the recesses in the patterned surface, and
  a computer configured to derive data from the signal concerning one or more voids at the interface during the filling period, and to derive an estimated end time for the filling period from a relationship between the data and time.

2. The apparatus of claim 1, further comprising a light source configured to direct the light onto the interface.

3. The apparatus of claim 1, further comprising a focusing device arranged to form an image of the interface at the detector.

4. The apparatus of claim 3, further comprising an image analyzer configured to analyze the image to obtain the data from an image of the one or more voids at the interface.

5. The apparatus of claim 1, further comprising a controller configured to control operation of the apparatus, the controller arranged to commence one or more further processing steps at one or more commencement times determined from the estimated end time.

6. An imprint apparatus comprising:
   an imprint holder configured to hold an imprint template, the imprint template having a patterned surface to pattern an imprintable liquid medium on a substrate by contact between the patterned surface and the imprintable liquid medium,
   a substrate table configured to hold the substrate,
   a detector configured to collect and measure light emergent from an interface comprising one or more voids between the imprintable liquid medium and the patterned surface and to generate a signal therefrom, and
   a computer configured to calculate an estimated end time required for the imprintable liquid medium to substantially fill the recesses in the patterned surface from data derived from the signal generated by the detector.

7. The apparatus of claim 1, wherein the data includes information related to a size of the one or more voids.

8. The apparatus of claim 1, wherein the data includes information related to a rate of change of the size of the one or more voids.

9. The apparatus of claim 1, wherein the light emergent from the interface is focused to form an image of the interface and the detector is configured to analyze the image to select a set of voids from a plurality of voids, the data obtained from the subset of voids.

10. The apparatus of claim 9, wherein each of the voids in the set of voids has a size larger than a size-related statistic for the plurality of voids.

11. The apparatus of claim 1, wherein the computer is further configured to perform a learning process by which the relationship is modified using information from defect levels arising from remnants of unfilled voids in one or more previously patterned layers.

12. The apparatus of claim 1, wherein the computer is configured to determine a commencement time of one or more further processing steps from the estimated end time.

13. The apparatus of claim 12, wherein the computer is configured to determine a commencement time of illuminating the imprintable liquid medium with radiation for an illumination period, wherein the commencement time is prior to the estimated end time.

* * * * *